United States Patent [19]

Flagg

[11] 4,099,160
[45] Jul. 4, 1978

[54] ERROR LOCATION APPARATUS AND METHODS

[75] Inventor: Howard Lang Flagg, Boulder, Colo.

[73] Assignee: International Business Machines Corporation, Armonk, N.Y.

[21] Appl. No.: 705,645

[22] Filed: Jul. 15, 1976

[51] Int. Cl.² ............................................. G06F 11/12
[52] U.S. Cl. .................. 340/146.1 AL; 340/146.1 AV
[58] Field of Search ............ 340/146.1 AL, 146.1 AV

[56] References Cited

U.S. PATENT DOCUMENTS

| | | | |
|---|---|---|---|
| 3,278,729 | 10/1966 | Chien | 340/146.1 AL |
| 3,533,067 | 10/1970 | Zierler et al. | 340/146.1 AL |
| 3,648,236 | 3/1972 | Burton | 340/146.1 AL |
| 3,781,791 | 12/1973 | Sullivan | 340/146.1 AL |
| 3,958,220 | 5/1976 | Marshall | 340/146.1 AL |
| 3,983,536 | 9/1976 | Telfer | 340/146.1 AL |

Primary Examiner—Charles E. Atkinson
Attorney, Agent, or Firm—Herbert F. Somermeyer

[57] ABSTRACT

Location of multiple symbols in error is enhanced by using affine polynomial-based apparatus and methods. An algebraic trace function $\bar{0}$ (vector) provides a test for whether or not the location polynomial has roots in the field of interest. The selected roots then combine with previously calculated error-indicating syndromes to indicate symbols in error. Informational states developed for error location are employed to generate error patterns. Preferred apparatus includes a sequenced and buffered special purpose finite field processor, either of the random logic, array 2 Claims, 5 Drawing Figures

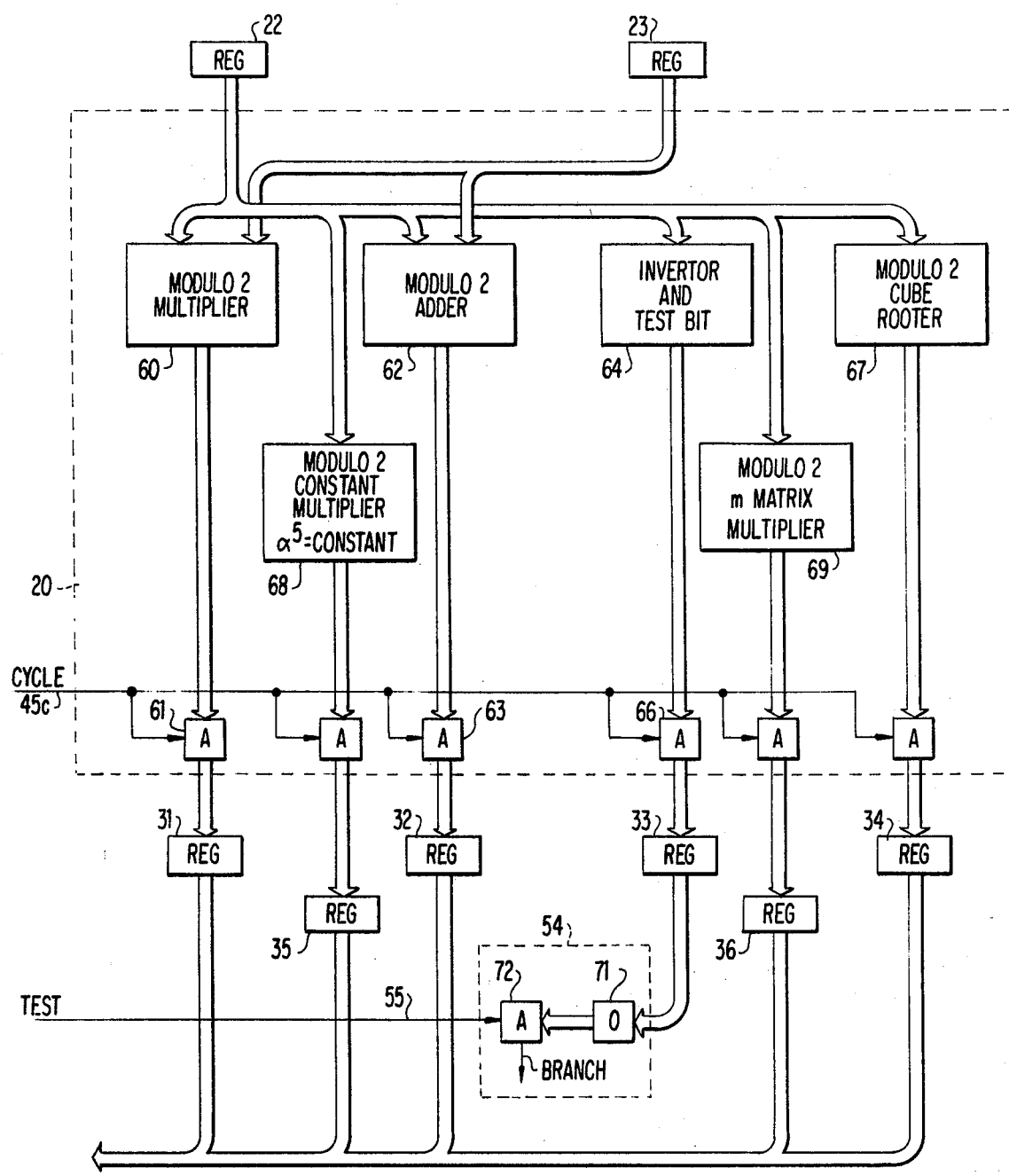

ERROR LOCATION APPARATUS AND METHODS

DOCUMENTS INCORPORATED BY REFERENCE

R. C. Bose and D. K. Ray-Chaudhuri, "On a Class of Error Correcting Binary Group Codes," INFORMATION AND CONTROL, Volume 3, Pages 68–79 (1960), is incorporated for the description of so-called BCH cyclic block code type of error detection and correction codes.

Elwyn and Berlekamp, ALGEBRAIC CODING THEORY, McGrawHill, 1968, Pages 241–272, is incorporated for discussion on linearized and affine polynomials.

BACKGROUND OF THE INVENTION

The subject invention relates to error location and correction apparatus and methods particularly useful for locating and correcting multiple symbols in error.

Error detection and correction apparatus and methods have been used in connection with data processing and affiliated operations for ensuring high data integrity necessary for achieving precise and correct results. Included in these error detection and correction procedures are so-called cyclic block codes, such as described by Bose et al, supra. The block codes can either be to the base 2 (binary) or to some other base (nonbinary). In a preferred implementation of the present invention, nonbinary BCH codes are used, no limitation thereto intended.

A particular application of the invention relates to utilization of data storage in a storage medium. In general, data to be recorded in the storage medium is subjected to encoding procedures which append a plurality of check characters to the data to be recorded. There are two check characters for each symbol to be corrected. For example, if three symbols are to be detected, six check characters are used. The six check characters are the remainder polynomial produced by dividing $X^6 I(x)$ by the code's generator polynomial; $I(x)$ is the data signal sequence being encoded for error detection and correction. The six check characters are a single remainder $R(x)$ resulting from the division process.

Locating one symbol in error follows known straight-forward techniques. However, when multiple symbols, particularly more than two symbols in error, are desired to be corrected in a set of data signals, then error location procedures and apparatus can become unduly complicated. Considerable time may be required for locating the symbols in error. In a storage medium, it is highly desirable that the location and correction of errors occur in a time period not exceeding the elapsed time required for reading a set of data signals from a record medium. This imposes severe constraints on the designer in that costs have to be carefully controlled. One example of an attempt for reducing time in location errors is a so-called "Chien" search. The Chien search is an algorithmic approach which, on the average, can locate errors rather rapidly. However, there are worst case situations wherein the time consumed for error location may cause the error correction apparatus to take more time than the transmission time of one data set. Accordingly, the Chien search is not satisfactory for the purposes enunciated above. In avoiding the Chien search, one of the difficulties in error location is the solution of simultaneous nonlinear equations, there being one equation for each of the roots to be identified. The solution to the simultaneous equations and the calculations of the roots for generating error location symbols must proceed in a predetermined manner such that elapsed time for both error locations and error correction can be predicted with certainty for achieving error location and correction within one transmission cycle. It is also desirable to use the same mechanisms for error correction irrespective of the number of symbols in error.

SUMMARY OF THE INVENTION

It is an object of the invention to provide an enhanced error location and correction apparatus and method.

For an error locating decoder, means receive a given number of data symbols and 2N check symbols defineable as being a given remainder polynomial, N being a positive integer. A decoder generates 2N error syndromes using the received symbols and based upon a predetermined generator polynomial. Means indicate the number of symbols in error up to N. The invention enhances the above apparatus by locating and correcting more than two symbols in error by adding means for converting an error location polynomial into an affine polynomial. Means then test the constant term of the affine polynomial for Trace $(k)=0$ to assure roots exist in the field of interest. Means select which root symbols exhibit a predetermined Trace function and combine the root symbols with the syndrome symbols for indicating error location in a predictive time period.

Apparatus embodying the invention may include a $GF(2^\eta)$ field element processor providing a plurality of output registers such as for holding product sum, invert, decimal, and root. A plurality of buffers are interconnected between the field element processor and the output registers all controlled by a sequence control which sequences the field element processor operations to achieve the results stated in the paragraph above. In another version of the invention, a log/anti-log store is added to a conventional processor with the error location procedures being program initiated with the log-/anti-log store converting the finite field vectors into logarithmic form for reducing multiplication and inversion times. In another version, the roots of the error location procedures are predicted; and table look-up apparatus identifies the roots for locating the symbols in error by back substitution of the table look-up roots into error location polynomial apparatus. Both versions implement the same algebraic functions.

An affine polynomial is a special form of a linearized polynomial of a finite field. Specifically, an affine polynomial is a linearized polynomial minus a constant wherein the constant equals the $\bar{0}$ vector. In a preferred form of the invention, the apparatus realizes a reduced form of an affine polynomial wherein for correctible errors the constant of the affine polynomial has the algebraic Trace function $\bar{0}$. $\bar{0}$ is an all-0 field element or vector. Whenever this reduced form guarantees unique roots within the field of interest, Trace $(k)=0$ apparatus realizing a reduced affine polynomial enables predicting roots for two, three, four, etc., symbols in error.

The foregoing and other objects, features, and advantages of the invention will become apparent from the following more particular description of the preferred embodiment, as illustrated in the accompanying drawing.

THE DRAWING

FIG. 5 is a block signal flow diagram of a field element processor usable with the FIG. 2 illustrated apparatus.

THEORY OF OPERATION

Figure 1:
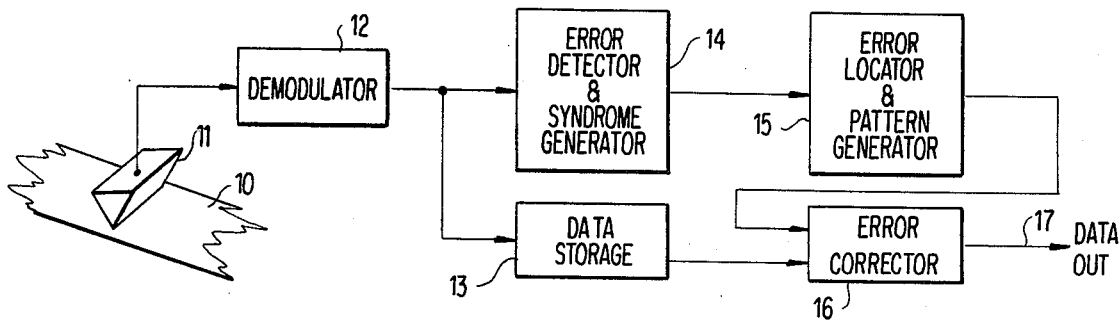
FIG. 1 is a diagrammatic showing of apparatus which may advantageously employ the present invention.

The invention is described in terms of a nonbinary BCH code, distance seven, no limitation thereto intended. For example, to locate and correct four symbols in error a distance nine code would be used. The code symbols are taken from the finite field $GF(2^4)$. As used herein, the term "$\alpha$" is a primitive element of this finite field such that the code set includes all polynomials set forth below:

$F(x)$ yields roots $\alpha^0, \alpha^1, \alpha^2, \alpha^3, \alpha^4, \alpha^5$ As a result of the above, the generator polynomial is:

$$g(x) = (x+\alpha^0)(x+\alpha^1) \ldots (x+\alpha^5) \tag{2}$$

The term $F(x)$ is a multiple of $g(x)$, modulo $GF(2^4)$, based upon modulo 2 arithmetic.

The number of check symbols is six and the number of information-bearing symbols can be nine. The codewords to be transmitted to and from storage are generated in a known manner for appending the check symbols to the information-bearing symbols.

For the error detection and correction phase of the operation of which the present invention is pointed, the detection procedure substitutes the roots ($\alpha^0 \ldots \alpha^5$) into a polynomial $S(x)$ and checks for the vector field element $\bar{0}$ using the. The polynomial $S(x)+E(x)$, wherein the latter term is an error polynomial. The detection apparatus calculates $S(\alpha^i)$ for all values 0–5 of $i$ as follows:

$$S(\alpha^i) = F(\alpha^i) + E(\alpha^i) \tag{3}$$

From the above:

$$F(\alpha^i) = \bar{0} \tag{4}$$

Since (4) is true, then equation (3) simplifies to the other two terms in the equation. If no errors have occurred in the code word, then:

$$S(\alpha^i) = \bar{0} \tag{5}$$

The polynomials used herein are written in the general form:

$$a_0X^0 + a_1X^1 \ldots + a_{n-2}X^{n-2} + a_{n-1}X^{n-1} \tag{6}$$

wherein any of the "$a$'s" are taken from the finite field $GF(2^4)$.

For error detection and correction, assume that error $e_1$ occurred in the ith symbol, error $e_2$ occurred in the jth symbol, and error $e_3$ occurred in the kth symbol; the ith symbol is the first-appearing symbol in error, the jth the second-appearing symbol in error, and the kth the third-appearing symbol in error. The three symbols in error need not be contiguous. As a result, the error polynomial becomes:

$$E(x) = e_1X^i + e_2X^j + e_3X^k \tag{7}$$

To correct the errors, the roots have to be substituted into the error polynomial which obtains:

$$E(\alpha^0) = e_1(\alpha^0)^i + e_2(\alpha^0)^j + e_3(\alpha^0)^k \tag{8}$$

$$E(\alpha^1) = e_1(\alpha^1)^i + e_2(\alpha^1)^j + e_3(\alpha^1)^k$$

$$E(\alpha^5) = e_1(\alpha^5)^i + e_2(\alpha^5)^j + e_3(\alpha^4)^k$$

OR $$E(\alpha^0) = e_1(\alpha^i)^0 + e_2(\alpha^j)^0 + e_3(\alpha^k)^0 \tag{9}$$

$$E(\alpha^1) = e_1(\alpha^i)^1 + e_2(\alpha^j)^1 + e_3(\alpha^k)^1$$
$$E(\alpha^5) = e_1(\alpha^i)^5 + e_2(\alpha^j)^5 + e_3(\alpha^k)^5$$

Let:

$$S_\alpha i = E(\alpha^i) \tag{10}$$

$$l_1 = \alpha^i;\ l_2 = \alpha^j;\ l_3 = \alpha^k \tag{11}$$

($l_1 - l_3$ are location vectors)

Then, (9) becomes:

$$S_\alpha 0 = e_1 + e_2 + e_3 \tag{12}$$

$$S_\alpha 1 = e_1 l_1 + e_2 l_2 + e_3 l_3$$

$$S_\alpha 2 = e_1 l_1^2 + e_2 l_2^2 + e_3 l_3^2$$

$$S_\alpha 5 = e_1 l_1^5 + e_2 l_2^5 + e_3 l_3^5$$

The decoding-correcting problem consists of solving these nonlinear equations (12) for the unknowns $e$ and $l$. In general, calculation of $S_\alpha i$ determines the number of errors, then location vector $l$ can be defined, the calculated location vector is substituted into $S_\alpha i$ resulting in a linear system of equations. Then $e_j$ is determined and added to the received symbols in the position specified by the error vector for correcting the symbol in error.

Error location polynomials have been described by several people including Berlekamp, supra, and Peterson, "Error Correcting Codes," MIT Press, 1961. Error location polynomials have a degree equal to the number of symbols to be corrected, i.e., equal to the number of symbols in error. Peterson has shown that $S_\alpha i$ and the coefficients of the error location polynomial are related by a system of equations set forth below wherein the term "$\lambda$" is a coefficient of the error location polynomial.

$$S_\alpha 0 \lambda_3 + S_\alpha 1 \lambda_2 + S_\alpha 2 \lambda_1 = S_\alpha 3 \tag{13}$$

$$S_\alpha 1 \lambda_3 + S_\alpha 2 \lambda_2 + S_\alpha 3 \lambda_1 = S_\alpha 4$$

$$S_\alpha 2 \lambda_3 + S_\alpha 3 \lambda_2 + S_\alpha 4 \lambda_1 = S_\alpha 5$$

The solution for the degree of the error location polynomial can be approached in one of two ways. First, determine whether or not there are three errors. This is done by placing the equations (13) in determinant form and solving for the vector $\bar{0}$. If the result of the computation is $\bar{0}$, then three errors are not detected. If the result of the computation is nonzero, then there are three errors. The same can be done for two errors, for single errors, and for no errors. The reverse can also be achieved by first calculating for zero errors, then one error, two errors, and three errors. Either procedure is completely satisfactory for practicing the present invention. However, the probability of having fewer errors is greater than having a larger number of errors. Therefore, the latter procedure can save time in error detection and correction procedures.

Once the number of errors, i.e., the degree of the error location polynomial, has been determined, the coefficients $\lambda_i$ of the polynomial are calculated. It is preferred for the present embodiment that the solution be in accordance with Cramer's Rule. The equations in accordance with Cramer's Rule are set forth below:

SINGLE ERROR: $\lambda_1 = (S_{a1})/(S_{a0}) = l_1$ (14)

DOUBLE ERROR: $\lambda_1 = \dfrac{S_{a0}S_{a3} + S_{a1}S_{a2}}{S_{a0}S_{a2} + S_{a1}S_{a1}}$ (15)

TRIPLE ERROR: $\lambda_1 = (A/B); \lambda_2 = (C/D); \lambda_3 = (E/F);$ (16)

Where:
$A = S_{a0}S_{a2}S_{a5} + S_{a0}S_{a3}S_{a4} + S_{a1}S_{a1}S_{a5} + S_{a1}S_{a2}S_{a4} S_{a1}S_{a3}S_{a3} + S_{a2}S_{a2}S_{a3}$ $B = S_{a0}S_{a2}S_{a4} + S_{a0}S_{a3}S_{a3} + S_{a1}S_{a1}S_{a4} + S_{a2}S_{a2}S_{a2}$ $C = S_{a0}S_{a4}S_{a4} + S_{a0}S_{a3}S_{a5} + S_{a1}S_{a3}S_{a4} + S_{a2}S_{a3}S_{a3} + S_{a1}S_{a2}S_{a5} + S_{a2}S_{a2}S_{a4}$ $D = S_{a0}S_{a2}S_{a4} + S_{a0}S_{a3}S_{a3} + S_{a1}S_{a1}S_{a4} + S_{a2}S_{a2}S_{a2}$ $E = S_{a3}S_{a3}S_{a3} + S_{a1}S_{a4}S_{a4} + S_{a1}S_{a3}S_{a3} + S_{a2}S_{a2}S_{a5}$ $F = S_{a0}S_{a2}S_{a4} + S_{a0}S_{a3}S_{a3} + S_{a1}S_{a1}S_{a4} + S_{a2}S_{a2}S_{a2}$ From the above, it is seen that for the single error case calculation of $\lambda_1$ results in the calculation of the location vector. However, in the double and triple error situations, the roots of the quadratic or cubic error location polynomial have to be extracted. While iterative search techniques may be used for solution of the nonlinear set of equations, the time required for a given successful search is not always fully predictive. Of course, maximum search time is known. The root extraction method employed by the present invention eliminates an iterative search. All functions are based upon algebraic calculations resulting in mathematically precise calculation times. The number of calculation steps in the apparatus and method is fixed for a given number of errors and independent of the number of symbols in the codeword. As codewords become longer, i.e., the efficiency of the transmission of storage system is enhanced by reducing the percentage redundancy, the iterative processes become increasingly long and inefficient. It is also possible to simplify the logic requirements, hence, reduce costs.

The bases of the invention reside in so-called affine polynomials which are a specific subclass of linearized polynomials as previously defined. Berlekamp, supra, also has shown that the roots of this special class of polynomials over finite fields can be found by the solution of simultaneous equations. Such polynomials have been referred to as "p-polynomials" and termed "linearized polynomials" by Berlekamp. In the earlier version, the term "p" represents the characteristics of the finite field. A linearized polynomial $L(x)$ takes the form of:

$L(x) = X^2 + \lambda_1 X$ (17)

In general linearized polynomials are in the form:

$L(x) = \Sigma L_i X^{p_i}$ for $L_i \epsilon GF(P^m)$ (18)

The symbol $\epsilon$ is a set containment symbol; $A \epsilon B$ means A is on $\Delta$ element of set B.

Berlekamp has shown that if:
$\alpha_9^0 \alpha_9^1 \ldots \alpha^{m-1}$ are standard bases of $GF(p^m)$; such that for any $\alpha^k \epsilon GF(p^m)$:

$\alpha^k = Z_0\alpha^0 + Z_1\alpha^1 + \ldots Z_{m-1}\alpha^{m-1}$ (19)

where $Z_i \epsilon GF(p)$.

If $L(x)$ is a linearized polynomial, then:

$$L(\alpha^k) = \sum_{i=0}^{m-1} Z_i L(\alpha^i)$$ (20)

$$= [Z_0 Z_1 \ldots Z_{m-1}] \begin{matrix} L(\alpha^0) \\ L(\alpha^1) \\ \vdots \\ L(\alpha^{m-1}) \end{matrix}$$

Using $L(x) = X^2 + \alpha^1 X$ where the roots and coefficient of the linearized polynomial lie in $GF(2^4)$ and using a generator polynomial:

$g(x) = X^4 + X + 1$ (21)

yields:
$L(\alpha^0) = (\alpha^0)^2 + \alpha^1(\alpha^0) = \alpha^4$ (22)

$L(\alpha^1) = (\alpha^1)^2 + \alpha^1(\alpha^1) = \overline{0}$ $L(\alpha^2) = (\alpha^2)^2 + \alpha^1(\alpha^2) = \alpha^7$ $L(\alpha^3) = (\alpha^3)^2 + \alpha^1(\alpha^3) = \alpha^{12}$ The solution of the L matrix of (20) is shown in equation (22).

From (22):

$$L(\alpha^k) = [Z_0 Z_1 Z_2 Z_3] \begin{bmatrix} \alpha^4 \\ 0 \\ \alpha^7 \\ \alpha^{12} \end{bmatrix}$$ (22A)

or:

$$L(\alpha^k) = [A\,A\,A\,A] \begin{bmatrix} 1 & 1 & 0 & 0 \\ 0 & 0 & 0 & 0 \\ 1 & 1 & 0 & 1 \\ 1 & 1 & 1 & 1 \end{bmatrix}$$ (22B)

An affine polynomial is the difference of a linearized polynomial and a constant within finite field $GF(p^m)$. Such an affine polynomial is shown below:

$F(x) = X^2 + \alpha^1 X + \alpha^{12}$ (23)
$= L(\alpha^k) + \alpha^{12}$ (24)

Therefore, equations (22) can be treated as affine polynomials. The roots are determined by setting the function to zero, making the constant $\alpha^{12}$ equal to the polynomial $L(\alpha^k)$. From equations (20) and (22), the constant (matrix vector) $\alpha^{12}$ is determined. This resolves the procedures to a linear system. The two solutions in $GF(2^4)$ are $R1 = \alpha^3$ and $R2 = \alpha^9$, wherein R's are the roots. Accordingly, if the polynomial $F(x)$ was an error location polynomial, the vectors $\alpha^3$ and $\alpha^9$ are the two error location vectors. Since all of the above-described two-error location polynomials are quadratics, they will also always be affine yielding a set of linear equations for determining error locations permitting straightforward algebraic designed apparatus and methods for error location procedures.

Certain advantages can be achieved by reducing the form of the location polynomials such that the linearized polynomial portion is the same for all error locations. This reduction in form allows the calculation of but one matrix [K] in solving the reduced quadratics for the two roots herein defined as $Z_1$, $Z_2$, wherein the roots of the original error location polynomial are:

$$X_1 = \lambda_1 Z_1; X_2 = \lambda_1 Z_2 \tag{25}$$

Reducing this general quadratic polynomial:
$$X^2 + \lambda_1 X + \lambda_2 \tag{25A}$$

is achieved by dividing the polynomial by $\lambda_1{}^2$ and substituting Z and $X/\lambda 1$ yielding:

$$Z^2 + Z = \lambda_2/(\lambda_1{}^2) \tag{26}$$

A further observation of quadratic polynomials in the finite field GF($p^m$) enables predicting all possible solutions and storing same in a table look-up type of apparatus.

It has been shown by Berlekamp and others that the quadratic over the finite field GF($p^m$):

$$Z^2 + Z + \mu = 0 \tag{27}$$

has solutions in the finite field if and only if the Trace function of $\mu$ is $\bar{0}$ and that the Trace value TR($\mu$) is:

$$TR(\mu) = \sum_{i=0}^{m-1} \mu^{p^i} \text{ for } \mu \in GF(p^m) \tag{28}$$

It turns out that one-half the field elements of the finite field have a Trace of $\bar{0}$ and the other half have a Trace of $\bar{1}$. An interesting property of this trace function is that the sum of two field elements whose Trace is the same regardless of whether it is $\bar{0}$ or $\bar{1}$ will have a Trace of $\bar{0}$. On the other hand, the sum of two field elements having different traces yield a sum having a Trace of $\bar{1}$. Accordingly, all those field elements in this finite field having a Trace of $\bar{0}$ residue in a mathmatical subspace over GF(p). The number of field elements in such a subspace is $2^m/2$ or a subspace having a dimension of $m-1$. Accordingly, only those elements having a Trace of $\bar{0}$ have solutions in the finite field GF($2^m$). For solutions to exist, $\mu$ has to be a member of the subspace; therefore, the term $\mu$ is describable by a linear combination of $m-1$ bases vectors. Further, the solutions to equation (27) are linear combinations of the solutions to the quadratic equation:

$$Z^2 + Z + \alpha^i = 0 \text{ for } 0 \leq i \leq m-1 \tag{29}$$

wherein $\alpha^i$ are the basis vectors of the original finite field GF($2^m$).

Finally, the basis for the two-error location polynomial solution resides on the following procedure:

(1) $0 \leq i \leq (m-1)$; the standard basis vectors of finite field GF($2^m$).

(2) $\alpha^L$ is any element of finite field GF($2^m$) having a Trace of $\bar{1}$.

(3) Calculate $Z_i$ such that the following is true:
$$Z_i^2 + Z_i = \alpha^i \text{ for } TR(\alpha^i) = \bar{0} \tag{30}$$

$$Z_i^2 + Z_i = \alpha^i + \alpha^L \text{ for } TR(\alpha^i) = \bar{1}$$

(4) the constant term $\mu$ in $Z_i^2 + Z_i + \mu = 0$ in the form $U_0 \ldots U_{m-1}$; then one root solution R1 to equation (27) is given by the calculation matrix:

$$[U_0 U_1 \ldots U_{m-1}] \begin{bmatrix} Z_0 \\ Z_1 \\ \vdots \\ Z_{m-1} \end{bmatrix} = ]R_{10} R_{11} \ldots R_{1(m-1)}] \tag{31}$$

(5) The second root solution R2 is given by the equation:

$$R_2 = R_1 + \alpha^0 \tag{32}$$

(6) The root solution of the original error location polynomial then becomes:

$$X_1 = \lambda_1 R_1 \tag{33}$$

$$X_2 = \lambda_1 R_2$$

The resultant procedures for locating two symbols in error then become the following:

(1) Calculate $\lambda_1$, $\lambda_2$.
(2) Calculate $\lambda_2/(\lambda_1{}^2)$.
(3) multiply the result of (2) above by the Z matrix of equation (31) yielding the first root R1.
(4) Sum R1 and $\alpha^0$ for obtaining R2.
(5) Solve the error location equations (33) for obtaining X1 and X2.

LOCATING THREE SYMBOLS IN ERROR

The three symbols in error location polynomial:

$$X^3 + \lambda_1 X^2 + \lambda_2 X + \lambda_3 = 0 \tag{34}$$

is not an affine polynomial. Accordingly, it is not solved by simultaneous equations. Berlekamp has suggested multiplying the cubic error location polynomial equation by a suitable linear factor to produce a quartic which is affine. Such quartic could be solved by simultaneous equations; then the extra root is discarded. However, a separate parity tree must be generated for the three symbol in error location.

In accordance with the teachings of this invention, the same parity tree can be used for three and four error location as for two error location. The same parity tree is the Z matrix of equation (31), also used in locating three and four symbols in error.

To arrive at apparatus meeting the above criterion, equation (34) is first modified by substituting the terms $X_1 + \lambda_1$ for X. The resultant equation is reduced to:

$$X_1{}^3 + X_1(\lambda_1{}^2 + \lambda_2) + (\lambda_1 \lambda_2 + \lambda_3) = 0 \tag{35}$$

Then, the equation:

$$Z + \frac{\lambda_1^2 + \lambda_2}{Z} = X_1 \tag{36}$$

is substituted for $X_1$ of equation (35). The equation is then reduced to:

$$Z^3 + \frac{(\lambda_1^2 + \lambda_2)^3}{Z^3} + (\lambda_1\lambda_2 + \lambda_3) = 0 \tag{37}$$

Then, equation (37) is modified by multiplying by $Z^3$ yielding:

$$Z^6 = Z^3(\lambda_1\lambda_2 + \lambda_3) + (\lambda_1^2 + \lambda_2)^3 = 0 \tag{38}$$

Equation (38) can be changed to quadratic form to base $Z^3$:

$$(Z^3)^2 + (Z^3)(\lambda_1\lambda_2 + \lambda_3) + (\lambda_1^2 + \lambda_2)^3 = 0 \tag{39}$$

making $Z^3$ represented by W, the equation becomes:

$$W^2 + W(\lambda_1\lambda_2 + \lambda_3) + (\lambda_1^2 + \lambda_2)^3 = 0 \tag{40}$$

Equation (40) can be placed in reduced form by dividing by the term $(\lambda_1\lambda_2 + \lambda_3)^2$; by making Y equal to $W/(\lambda_1\lambda_2 + \lambda_3)$, the entire equation becomes:

$$Y^2 + Y + \frac{(\lambda_1^2 + \lambda_2)^3}{(\lambda_1\lambda_2 + \lambda_3)^2} = 0 \tag{41}$$

which is an affine polynomial, the solution of which follows two symbol in error location polynomial above described.

In solving equation (41), once the constant term is calculated, it is multiplied by the same matrix used in the two error case, i.e., the Z matrix of equation (31). This calculation obtains the first root R1. R2 is solved in the same manner as set forth for the two symbol in error correction.

This, of course, does not directly point to the three symbols in error. One of the roots R1, R2 is selected; and then a reverse calculation through the above substitutions finds the roots of the original cubic error location. In a three symbol in error situation, the R1 root is always ignored. That is, it is possible that the constant of equation (41) equals 0. In the two symbol in error situation, the quantity $\lambda_2/\lambda_1^2$ never will be the vector $\overline{0}$ if there are actually two symbols in error. This situation indicates that root R1 in the three symbol in error case could be $\overline{0}$. However, R2 will never be $\overline{0}$ provided the Z matrix of equation (31) is generated in a particular manner. That is, the Z matrix is constructed such that the first column contains all zeroes. When multiplying with the Z matrix the first bit of the answer vector must be zero. Then, adding $\alpha^0$ to the R1 answer vector, the first bit of the R2 answer vector is 1. Since $\alpha^0 = [100\ldots]$, $\alpha^0 + R1 = [100\ldots] + [0\ldots] = [1\ldots]$. Which means R2 is never 0.

In the illustrative embodiment, the root R2 will always be solved for obtaining the roots of the original cubic three-symbol-in-error location polynominal. Based upon these selections, the methodology becomes:

(1) Calculate $\lambda_1$, $\lambda_2$, $\lambda_3$.
(2) Calculate the constant of equation (41).
(3) Multiply the calculated constant by the Z matrix of equation (31) for finding root R1.
(4) Calculate the root R2 as for the two symbol in error correction procedures.
(5) Calculate the quantity R2 $(\lambda_1\lambda_2 + \lambda_3)$ making the calculation equal to K, K being a field element of $GF(2^m)$ such that it has three cube roots, i.e., three unique field elements $\alpha^P$, $\alpha^Q$, and $\alpha^R$, all within finite field $GF(2^m)$.

(6) Calculate the three cube roots of K. Such cube rooting can be on table look-up, circuit calculation, or program calculation. One of the roots $\alpha^P$ can be stored or calculated with the other roots being calculated as follows:

$$\alpha^Q = (\alpha^P)(\alpha^{(n-1)/3}) \tag{42}$$

$$\alpha^R = (\alpha^Q)(\alpha^{(n-1)/3}) \tag{43}$$

where $n = 2^m$.

(7) The three error locations $l_1$, $l_2$, and $l_3$ then become:

$$l_1 = \lambda_1 + \alpha^P + (\lambda_{12} + \lambda_2)(\alpha^P)^{-1} \tag{44}$$

$$l_2 = \lambda_1\alpha^Q + (\lambda_{12} + \lambda_2)(\alpha^Q)^{-1}$$

$$l_3 = \lambda_1 + \alpha^R + (\lambda_{12} + \lambda_2)(\alpha^R)^{-1}$$

ERROR PATTERN GENERATION

Once the symbols in error have been located, the error pattern of each symbol has to be defined. Since the error location procedures of the present invention have employed solution of simultaneous equations and certain information has been developed useful for error pattern generation, apparatus and methods of the invention employ such information for defining the error patterns. From equations (12), based upon Cramer's Rule, the three error patterns are defined as:

$$e_1 = (G/H); \quad e_2 = (V/W) \tag{45}$$

$$G = S_a0(l_2l_{32} + l_{22}l_3) + S_a1(l_{32} + l_{22}) + S_a2(l_3 + l_2)$$

$$H = l_2l_{32} + l_{22}l_3 + l_1l_{32} + l_{12}l_3 + l_1l_{22} + l_{12}l_2$$

$$V = S_a0(l_1l_{32}) + l_{22}l_3) + S_a1(l_{12} + l_{32}) + S_a2(l_1 + l_3)$$

$$W = l_2l_{32} + l_{22}l_3 + l_1l_{32} + l_{12}l_3 + l_1l_{22} + l_{12}l_2$$

$$e_3 = e_1 + e_2 + S_a0$$

In the double error situation, $e_3$ is 0 for the error pattern from equation (12). Take the first two equations and the two left terms of the equations in solving for $e_1$ and $e_2$ of these two simultaneous equations, then the error pattern is defined as:

$$e_1 = S_a0 + e_2 \tag{46}$$

$$e_2 = \frac{S_a1 + l_1S_a0}{l_1 + l_2}$$

Finally, in the single error case, the error pattern is $S_a0$. The only remaining operation to be performed after decoding in accordance with the above theory of operation is to modulo two add the indicated error patterns to the indicated symbols in error.

A FIRST EMBODIMENT

Referring now more particularly to the drawing, like numerals indicate like parts and structural features in the various diagrams. All descriptions assume that the encoded message has been completed using known BCH encoding techniques. In all cases, there will be a number of data symbols, such as nine, with six check symbols C1-C6. The description pertains to the decoding, detection of errors, location of errors, and correction of errors based up on receiving such an encoded message from record medium 10. The message is sensed by transducer 11, then supplied through a demodulator 12 for error processing. First, the encoded message is stored in a data storage unit 13 and, simultaneously, the message is decoded and errors detected by error detector and syndrome generator 14. Further, an error locator and pattern generator 15 locates the errors and generates error patterns as described in the "Theory of Operation". In practice, and as shown herein, apparatus for embodying functions 14 and 15 can be shared or separate. Finally, the error patterns with the location of symbols in error are combined with signals from data storage 13 by error corrector 16 to supply correct data signals over line 17. Of course, with no errors, no action is taken by corrector 16 and data from storage 13 merely passes through corrector 16 without alteration.

Different length symbols and different length code words may be employed while practicing the present invention. The exercise of design choices is a function of so many variables that they will not be set forth herein. If a six-bit symbol were to be used with the present invention, the primative polynomial $X^6 + S + 1$ is an advantageous polynomial to base the error detection and correction system upon. As a result, the generator polynomial would be:

$$g(X) = X^6 + X^5\alpha^{58} + X^4\alpha^{46} + X^3\alpha^{40} + X^2\alpha^{51} + X\alpha^5 + \alpha^{15} \qquad (47)$$

Six check symbols are generated for handling three errors without ancillary pointers. Any primitive polynomial can be used for generating the field from which the code polynomial $g(X)$ is obtained for effecting error detection and correction, and the error location of the present invention. The symbol field has to be constrained as explained above.

Figure 2:
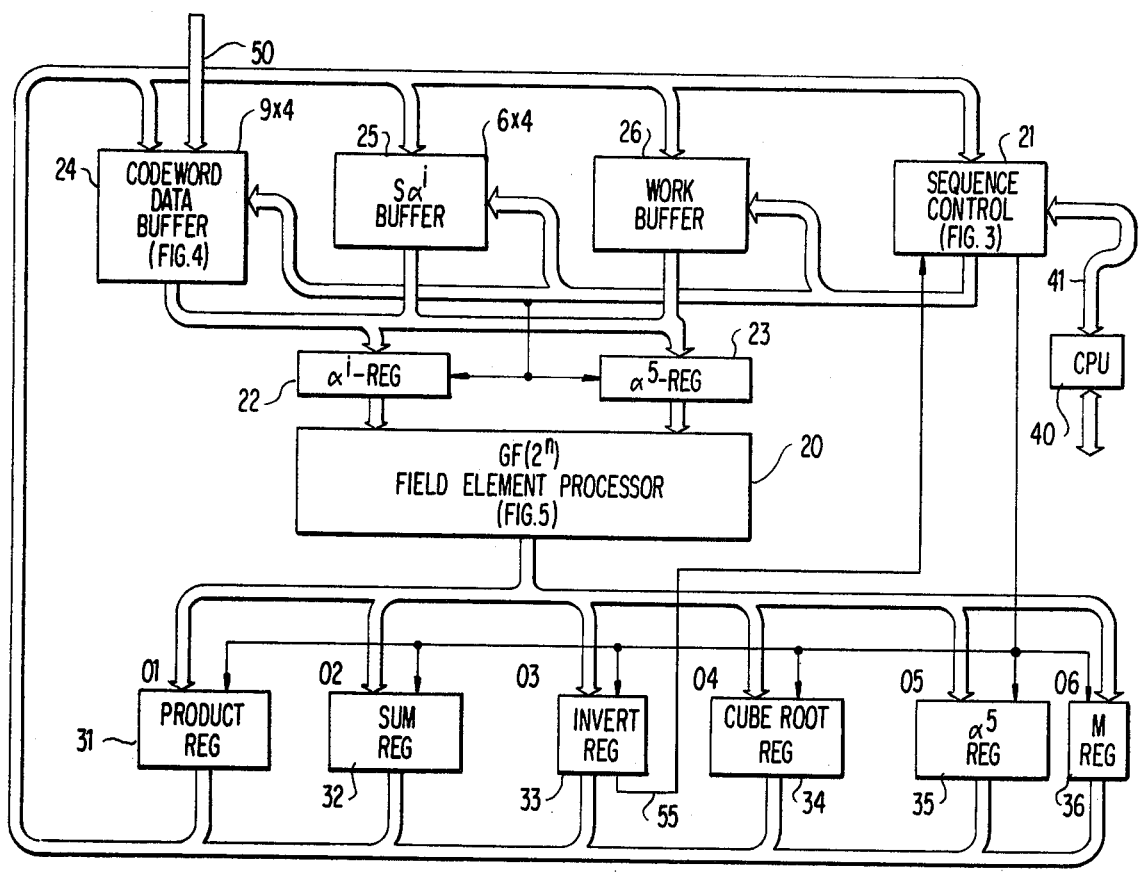
FIG. 2 is a block signal flow diagram of apparatus employing the invention and operable with the FIG. 1 illustrated apparatus.
Figures 3, 4:
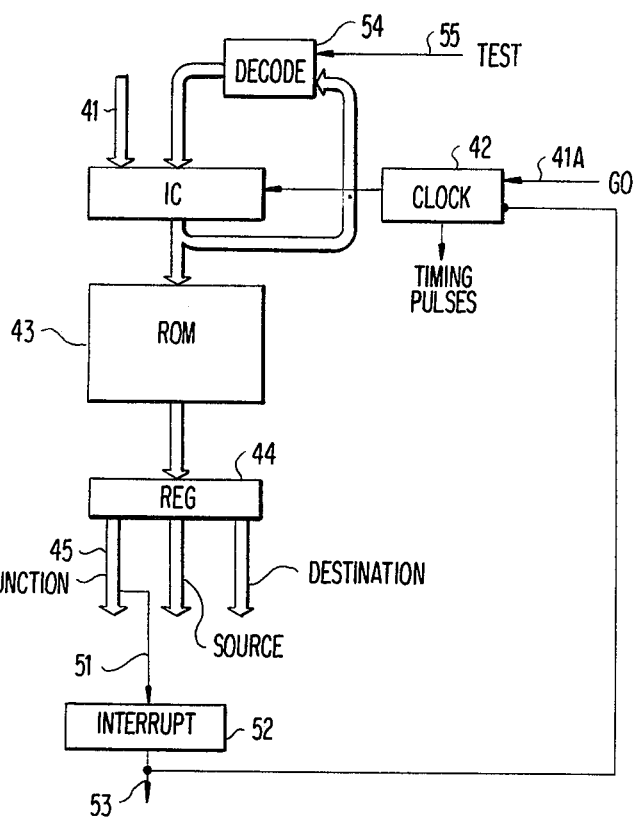
FIG. 3 is a combined signal flow and block diagram of a sequence control for timing the operations of the FIG. 2 illustrated apparatus.
FIG. 4 is a diagram showing the layout for codeword data in a buffer.

Referring next to FIG. 2, a programmed decoder is shown using field element processor 20 sequenced under sequence control 21 shown and described later with respect to FIG. 3. A plurality of buffers is provided with the inputs to the field element processor 20 being the $\alpha_i$ register 22 and the $\alpha_j$ register 23. These registers receive signals from the three buffers 24, 25, and 26 respectively labeled code word data buffer, $S_{\alpha i}$ buffer, and work buffer. Field element processor 20 shown in FIG. 5 outputs to six output registers 31-36 denominated as shown in the figure. Sequence control 21 gates the output of field element processor 20 to these registers for selecting which output is to be used and inserted either into the $S_{\alpha i}$ buffer or the work buffer. For one computation of field element processor 20, a plurality of results may be stored. It is to be understood that processor 20 operates in modulo 2 arithmetic yielding results in the finite field $GF(P^m)$.

Sequence control 21 (shown in FIG. 3) executes a program of instructions, later described, for selecting the outputs of registers 31-36 which are the results of the calculations of field element processor 20. A controlling CPU (central processing unit) 40 actuates sequence control 21 by sending a set of instruction signals over cable 41 to set instruction counter IC to the first address of a program to be executed. Simultaneously, a "go" signal received on line 41A of cable 41 actuates a clock 42 to supply timing pulses for sequencing the FIG. 2 illustrated apparatus in a known manner. The output signals from register IC go to a program containing read only memory (ROM) 43 which selects the register having an instruction word in a known manner. The instruction word is supplied to register 44 which staticizes same for one cycle of operation, as is well known. Register 44 supplies three outputs — a function output over cable 45 which selects the inputs of modulo $GF(2^n)$ element processor 20 as being either 22 or 23, selects the switch of the output registers 31-36 to supply signals to one of the two buffers, or selects one of the three buffers 24-26 to supply data signals to one or both of the input registers 22 and 23. The sequence control contains two addresses, a source and destination address. Each function has one source and one destination address, as will become apparent.

The four functions executable by sequence control 21 are WRITE (W), READ (R), CYCLE (C), and TEST (T). The WRITE function transfers signals from one of the output registers 31-36 to one of the three buffers 24-26 in accordance with source and destination address fields. The READ function transfers signals from one of the buffers 24-26 to one or both of the input registers 22 and 23. The CYCLE function transfers signals from processor 20 to all of the output registers 31-36. It should be noted here that the WRITE function selects which output signal is to be stored in the respective buffers. TEST is a branch operation well known in the computer arts.

The address fields for either source or destination are set forth in the table below, wherein the X's indicate address field in a buffer memory.

| Value | Address Field Indication |
|---|---|
| 0XXX | Work Buffer 26 - WB |
| 1XXX | Syndrome Buffer 25 - SB |
| 2000 | Register 22 |
| 2001 | Register 23 |
| 2002 | Registers 22, 23 |
| 2003 | Register 31 |
| 2004 | Register 32 |
| 2005 | Register 33 |
| 2006 | Register 34 |
| 2007 | Register 35 |
| 2008 | Register 36 |
| 3XXX | Data Buffer 24 - DB |

In the instruction level flowcharts below, the indication is used to signify the address value. The description assumes that CPU 40 has supervisory programs for invoking the error location and correction procedures described herein. Upon loading data over cable 50 into data buffer 24, CPU 40 initiates subroutine A to detect errors. This is done by supplying a "go" signal over line 41A and setting the instruction counter IC by signals over cable 41 to address 0001. The instruction level flowchart below indicates the sequence of operation then invoked by sequence control 21.

| | Subroutine A: Error Detection 0001-0018 (i=0→5) | | | |
|---|---|---|---|---|
| Sequence # | Function | Source | Destination | Subject |
| 3i+1 | R | SBi | 22, 23 | Syndrome i |
| 3i+2 | C | 22 | 33 | $S_{\alpha i}=0?$ |
| 3i+3 | T | 33 | $S_{\alpha i}=0$; No Branch $i = i+1$ $S_{\alpha i}\neq 0$; 0019 $S_{\alpha}5=0$; No Error Exit | Branch |

In the branch instruction with no error, an instruction supplies an interruption signal over line 51 setting interrupt memory 52. Interrupt memory 52 disables clock 42 preventing further action by the FIG. 2 illustrated apparatus. Simultaneously, the interruption signal supplied over line 53 to CPU 40 indicates no error. This action allows CPU 40 to proceed with data processing operations. Once an error is detected by detecting that one of the syndromes is non-zero, the control 21 automatically branches to the number of error routine at address 0019 in ROM 43. This is done by decode circuit 54 responding to the TEST signal received over line 55 from register 33, as will be later described, transferring an encoded ROM address based upon the present address of IC. For example, if any address with 00 in the left two digits results in a successful test on line 55, decode 54 supplies address 0019. The branch indication is also provided by the third digit being less than five.

To determine the number of errors, sequence control 21 executes Subroutine B, Number of Errors Routine, as set forth below:

| Subroutine B: Number of Errors Routine 0019-0069 | | | | |
|---|---|---|---|---|
| Sequence # | Function | Source | Destination | Subject |
| 0019 | R | SB2 | 22, 23 | Detect 3-Errors $S_2$ |
| 0020 | C | 22, 23 | 31 | $S_2{}^2$ |
| 0021 | W | 31 | WB0 | $S_2{}^2$ |
| 0022 | R | SB0 | 23 | $S_0$ |
| 0023 | C | 22, 23 | 31 | $S_0 S_2$ |
| 0024 | W | 32 | WB1 | $S_0 S_2$ |
| 0025 | R | WB0 | 23 | WB0 |
| 0026 | C | 22, 23 | 31 | $S_2{}^3$ |
| 0027 | W | 31 | WB2 | $S_2{}^3$ |
| 0028 | R | WB1 | 22 | $S_0 S_2$ |
| 0029 | R | SB4 | 23 | $S_4$ |
| 0030 | C | 22, 23 | 31 | $S_0 S_2 S_4$ |
| 0031 | W | 31 | WB3 | $S_0 S_2 S_4$ |
| 0032 | R | SB1 | 22 | $S_1$ |
| 0033 | C | 22, 23 | 31 | $S_1 S_4$ |
| 0034 | W | 31 | WB4 | $S_1 S_4$ |
| 0035 | R | WB4 | 23 | $S_1 S_4$ |
| 0036 | C | 22, 23 | 31 | $S_1{}^2 S_4$ |
| 0037 | W | 31 | SB5 | $S_1{}^2 S_4$ |
| 0038 | R | SB3 | 22, 23 | $S_3$ |
| 0039 | C | 22, 23 | 31 | $S_3{}^2$ |
| 0040 | W | 31 | WB6 | $S_3{}^2$ |
| 0041 | R | WB6 | 23 | WB6 |
| 0042 | R | SB0 | 22 | $S_0$ |
| 0043 | C | 22, 23 | 31 | $S_0 S_3{}^2$ |
| 0044 | W | 31 | WB7 | $S_0 S_3{}^2$ |
| 0045 | R | WB7 | 22 | WB7 |
| 0046 | R | WB5 | 23 | WB5 |
| 0047 | C | 22, 23 | 32 | WB7+WB5 |
| 0048 | W | 32 | WB8 | WB7+WB5 |
| 0049 | R | WB3 | 23 | WB3 |
| 0050 | R | WB2 | 22 | WB2 |
| 0051 | C | 22, 23 | 32 | WB2+WB3 |
| 0052 | W | 32 | WB9 | WB2+WB3 |
| 0053 | R | WB9 | 22 | WB9 |
| 0054 | R | WB8 | 23 | WB8 |
| 0055 | C | 22, 23 | 32 | WB8+WB9 |
| 0056 | W | 32 | WB10 | WB8+WB9 |
| 0057 | R | WB10 | 22 | WB10 |
| 0058 | C | 22, 23 | 33 | 3-Errors? |
| 0059 | T | 33 | T=1; 0300 | Branch |
| 0060 | R | SB1 | 22, 23 | $S_1$ |
| 0061 | C | 22, 23 | 31 | $S_1{}^2$ |
| 0062 | W | 31 | WB11 | $S_1{}^2$ |
| 0063 | R | Wb11 | 22 | WB11 |
| 0064 | R | WB1 | 23 | WB1 |
| 0065 | C | 22, 23 | 32 | WB1+WB11 |
| 0066 | W | 32 | WB12 | WB1+WB11 |
| 0067 | R | WB12 | 22 | WB12 |
| 0068 | C | 22, 23 | 33 | 2-Errors |
| 0069 | T | 33 | T=1; 0200 T=0; 0100 | Branch |

The above Subroutine calculates the denominator in (15) and (16) and tests them.

If a single error is detected, then the branch at 0069 is to address 0100 for executing Subroutine C. Instruction level Subroutine C is shown below.

| Subroutine C: Locate and Correct Single Errors 0100-0109 - Enter Only From Error Routine | | | | |
|---|---|---|---|---|
| Sequence # | Function | Source | Destination | Subject |
| 0100 | R | SB0 | 22 | $S_0$ |
| 0101 | C | 22, 23 | 33 | $S_{0-1}$ |
| 0102 | W | 33 | WB13 | $S_{0-1}$ |
| 0103 | R | SB1 | 23 | $S_1$ |
| 0104 | R | WB13 | 22 | WB13 |
| 0105 | C | 22, 23 | 31 | Error Location |
| 0106 | R | $DB-S_1 S_{0-1}$ | 22 | Byte In Error - $DBS_1 S_{0-1}$ |
| 0107 | R | SB0 | 23 | EP is SB0 |
| 0108 | C | 22, 23 | 32 | $EP+DBS_1 S_{0-1}$ |
| 0109 | W | 32 | $DB-S_1 S_{0-1}$ | Corrected Byte |

CPU 40 enters a data transmittal program.

If, on the other hand, two errors are detected, the branch at 0069 is to address 0200 with the instruction level flowchart below.

| Subroutine D: Locate and Correct Double Error - 0200 - Enter Only From Error Routine | | | | |
|---|---|---|---|---|
| Sequence # | Function | Source | Destination | Subject |
| 0200 | W | 33 | WB13 | WB13 |
| 0201 | R | SB1 | 22 | $S_1$ |
| 0202 | R | SB2 | 23 | $S_2$ |
| 0203 | C | 22, 23 | 31 | $S_1 S_2$ |
| 0204 | W | 31 | WB14 | $S_1 S_2$ |
| 0205 | R | SB3 | 23 | $S_3$ |
| 0206 | C | 22, 23 | 31 | $S_1 S_3$ |
| 0207 | W | 31 | WB15 | $S_1 S_3$ |
| 0208 | R | SB0 | 22 | $S_0$ |
| 0209 | C | 22, 23 | 31 | $S_0 S_3$ |
| 0210 | W | 31 | WB16 | $S_0 S_3$ |
| 0211 | R | WB16 | 22 | WB16 |
| 0212 | R | WB14 | 23 | WB14 |
| 0213 | C | 22, 23 | 32 | WB14+WB16 |
| 0214 | W | 32 | WB17 | WB14+WB16 |
| 0215 | R | WB15 | 22 | WB15 |
| 0216 | R | WB0 | 23 | WB0 |
| 0217 | C | 22, 23 | 32 | WB0+WB15 |
| 0218 | W | 32 | WB18 | WB0+WB15 |
| 0219 | R | WB13 | 22 | WB13 |
| 0220 | R | WB17 | 23 | WB17 |
| 0221 | C | 22, 23 | 31 | (WB13) (WB17) |
| 0222 | W | 31 | WB19 | (WB13) (WB17) |
| 0223 | R | WB18 | 23 | WB18 |
| 0224 | C | 22, 23 | 31 | (WB18) (WB19) |
| 0225 | W | 31 | WB20 | (WB18) (WB19) |
| 0226 | R | WB19 | 22, 23 | WB19 |
| 0227 | C | 22, 23 | 31 | $WB19^2$ |
| 0228 | W | 31 | WB21 | $WB19^2$ |
| 0029 | R | WB21 | 22 | WB21 |
| 0230 | C | 22 | 33 | $WB21^{-1}$ |
| 0231 | W | 33 | WB22 | $WB21^{-1}$ |
| 0232 | R | WB22 | 23 | WB22 |
| 0233 | C | 22, 23 | 31 | (WB21) (WB22) |
| 0234 | W | 31 | WB23 | (WB21) (WB22) |
| 0235 | R | WB20 | 22 | WB20 |
| 0236 | C | 22, 23 | 31 | (WB20(WB22) |
| 0237 | W | 31 | WB24 | (WB20) (WB22) |
| 0238 | R | WB24 | 22 | WB24 |
| :230 | C | 22, 23 | 36 | (M) (WB24) |
| 0240 | W | 36 | WB0 | (M) (WB24) |
| 0241 | R | WB0 | 22 | WB0 |
| 0242 | R | WB23 | 23 | WB23 |
| 0243 | C | 22, 23 | 32 | WB0+WB23 |
| 0244 | W | 32 | WB1 | WB0+WB23 |
| 0245 | R | WB19 | 23 | WB19 |
| 0246 | C | 22, 23 | 31 | (WB19) (WB0) |
| 247 | W | 31 | WB2 | (WB19) (WB0) |
| 0249 | R | WB1 | 22 | WB1 (WB2=$l_1$) |
| 0249 | C | 22, 23 | 31 | (WB1) (WB19) |
| 0250 | W | 31 | WB3 | (WB1) (WB19) (WB3=$l_2$) |
| 0251 | R | WB2 | 22 | WB2 |
| 0252 | R | SB0 | 23 | $S_0$ |
| 0253 | C | 22, 23 | 31 | ($S_0$) (WB2) |
| 0254 | W | 31 | WB4 | ($S_0$) (WB2) |
| 0255 | R | WB3 | 23 | WB3 |
| 0256 | C | 22, 23 | 32 | WB2+WB3 |
| 0257 | W | 32 | WB5 | WB2+WB3 |

-continued

Subroutine D: Locate and Correct Double Error - 0200 - Enter Only From Error Routine

| Sequence # | Function | Source | Destination | Subject |
|---|---|---|---|---|
| 0258 | R | WB5 | 22 | WB5 |
| 0259 | C | 22, 23 | 33 | $WB5^{-1}$ |
| 0260 | W | 33 | WB6 | $WB5^{-1}(l_1)$ |
| 0261 | R | WB4 | 22 | WB4 |
| 0262 | R | SB1 | 23 | $S_1$ |
| 0263 | C | 22, 23 | 32 | $S_1+WB4$ |
| 0264 | W | 32 | WB7 | $S_1+WB4$ |
| 0265 | R | WB7 | 22 | WB7 |
| 0266 | R | WB6 | 23 | WB6 |
| 0267 | C | 22, 23 | 31 | (WB6) (WB7) (EP-2) |
| 0268 | W | 31 | WB8 | EP2 |
| 0279 | R | WB8 | 22 | EP2 |
| 0270 | R | SB0 | 23 | $S_0$ |
| 0271 | C | 22, 23 | 32 | $S_0+EP2$ |
| 0272 | W | 32 | WB9 | $S_0+EP2=(EP1)$ |
| 0273 | R | DB-WB3 | 23 | Byte In Error |
| 0274 | C | 22, 23 | 32 | (DB-WB3)+EP2 |
| 0275 | W | 32 | DB-WB3 | Corrected Byte |
| 0276 | R | WB9 | 22 | EP1 |
| 0277 | R | DB-WB2 | 23 | Byte In Error |
| 0278 | C | 22, 23 | 32 | (DB.WB2)+WB9 |
| 0279 | W | 32 | DB-WB2 | Corrected Byte |

CPU 40 enters a data transmittal program.

On the other hand, if three errors are detected, then the routine branches from 0059 to address 0300 from instruction 0059 of Subroutine B. This invokes Subroutine E as set forth below in the instruction level flowchart.

Subroutine E: Locate and Correct Triple Error 0300–0631 - Entered Only From Error Routine

| Sequence # | Function | Source | Destination | Subject |
|---|---|---|---|---|
| 0300 | R | SB5 | 23 | $S_5$ |
| 0301 | C | 22, 23 | 31 | (WB12) ($S_5$) |
| 0302 | W | 31 | WB11 | (WB12) ($S_5$) |
| 0303 | R | WB0 | 22 | WB0 |
| 0304 | C | 22, 23 | 31 | (WB0) ($S_5$) |
| 0305 | W | 31 | WB12 | (WB0) ($S_5$) |
| 0306 | R | SB4 | 23 | $S_4$ |
| 0307 | C | 22, 23 | 31 | (WB0) ($S_4$) |
| 0308 | W | 31 | WB13 | (WB0) ($S_4$) |
| 0309 | R | SB3 | 23 | $S_3$ |
| 0310 | C | 22, 23 | 31 | (WB0) ($S_3$) |
| 0311 | W | 31 | WB14 | (WB0) ($S_3$) |
| 0312 | R | WB6 | 22 | WB6 |
| 0313 | C | 22, 23 | 31 | (WB6) ($S_3$) |
| 0314 | W | 31 | WB15 | (WB6) ($S_3$) |
| 0315 | R | SB1 | 23 | $S_1$ |
| 0316 | C | 22, 23 | 31 | (WB6) ($S_1$) |
| 0317 | W | 31 | WB16 | (WB6) ($S_1$) |
| 0318 | R | SB2 | 23 | $S_2$ |
| 0319 | C | 22, 23 | 31 | (WB6) ($S_2$) |
| 0320 | W | 31 | WB17 | (WB6) ($S_2$) |
| 0321 | R | WB4 | 22 | WB4 |
| 0322 | C | 22, 23 | 31 | (WB4) ($S_2$) |
| 0323 | W | 31 | WB18 | (WB4) ($S_2$) |
| 0324 | R | SB3 | 23 | $S_3$ |
| 0325 | C | 22, 23 | 31 | (WB4) ($S_3$) |
| 0326 | W | 31 | WB19 | (WB4) ($S_3$) |
| 0327 | R | SB4 | 23 | $S_4$ |
| 0328 | C | 22, 23 | 31 | (WB4) ($S_4$) |
| 0329 | W | 31 | WB20 | (WB4) ($S_4$) |
| 0330 | R | SB4 | 22 | S4 |
| 0331 | C | 22, 23 | 31 | $S4^2$ |
| 0332 | W | 31 | WB21 | $S4^2$ |
| 0333 | R | SB3 | 23 | S3 |
| 0334 | C | 22, 23 | 31 | (S3) (S4) |
| 0335 | W | 31 | WB22 | (S3) (S4) |
| 0336 | R | SB5 | 22 | S5 |
| 0337 | C | 22, 23 | 31 | (S3) (S5) |
| 0338 | W | 31 | WB23 | (S3) (S5) |
| 0339 | R | SB2 | 23 | S2 |
| 0340 | C | 22, 23 | 31 | (S2) (S5) |
| 0341 | W | 31 | WB24 | (S2) (S5) |
| 0342 | R | SB0 | 22 | S0 |
| 0343 | R | WB21 | 23 | WB1 |
| 0344 | C | 22, 23 | 31 | (WB1) (S0) |
| 0345 | W | 31 | WB21 | (WB1) (S0) |
| 0346 | R | WB22 | 23 | WB22 |
| 0347 | C | 22, 23 | 31 | (WB22) (S0) |
| 0348 | W | 31 | WB22 | (WB22) (S0) |

Subroutine E: Locate and Correct Triple Error 0300–0631 - Entered Only From Error Routine

| Sequence # | Function | Source | Destination | Subject |
|---|---|---|---|---|
| 0349 | R | WB23 | 23 | WB23 |
| 0350 | C | 22, 23 | 31 | (WB23) (S0) |
| 0351 | W | 31 | WB23 | (WB23) (S0) |
| 0352 | R | SB1 | 22 | S1 |
| 0353 | C | 22, 23 | 31 | (WB23) (S1) |
| 0354 | W | 31 | WB25 | (WB23) (S1) |
| 0355 | R | WB24 | 23 | WB24 |
| 0356 | C | 22, 23 | 31 | (WB24) (S1) |
| 0357 | W | 31 | WB24 | (WB24) (S1) |
| 0358 | R | WB22 | 22 | WB22 |
| 0359 | R | WB18 | 23 | WB18 |
| 0360 | C | 22, 23 | 32 | WB18+WB22 |
| 0361 | W | 32 | WB18 | WB18+WB22 |
| 0362 | R | WB14 | 22 | WB14 |
| 0363 | R | WB16 | 23 | WB16 |
| 0364 | C | 22, 23 | 32 | WB14+WB16 |
| 0365 | W | 32 | WB14 | WB14+WB16 |
| 0366 | R | WB21 | 22 | WB21 |
| 0367 | R | WB23 | 23 | WB23 |
| 0368 | C | 22, 23 | 32 | WB21+WB23 |
| 0369 | W | 32 | WB21 | WB21+WB23 |
| 0370 | R | WB17 | 22 | WB17 |
| 0371 | R | WB19 | 23 | WB19 |
| 0372 | C | 22, 23 | 32 | WB17+WB19 |
| 0373 | W | 32 | WB19 | WB17+WB19 |
| 0374 | R | WB13 | 22 | WB13 |
| 0375 | R | WB24 | 23 | WB24 |
| 0376 | C | 22, 23 | 32 | WB13+WB24 |
| 0377 | W | 32 | WB24 | WB13+WB24 |
| 0378 | R | WB15 | 22 | WB15 |
| 0379 | R | WB20 | 23 | WB20 |
| 0380 | C | 22, 23 | 32 | WB15+WB20 |
| 0381 | W | 32 | WB15 | WB15+WB20 |
| 0382 | R | WB12 | 22 | WB12 |
| 0383 | R | WB25 | 23 | WB25 |
| 0384 | C | 22, 23 | 32 | WB12+WB25 |
| 0385 | W | 32 | WB25 | WB12+WB25 |
| 0386 | R | WB11 | 22 | WB11 |
| 0387 | R | WB18 | 23 | WB18 |
| 0388 | C | 22, 23 | 32 | WB11+WB18 |
| 0389 | W | 32 | WB11 | WB11+WB18 |
| 0390 | R | WB11 | 23 | WB11 |
| 0391 | R | WB14 | 22 | WB14 |
| 0392 | C | 22, 23 | 32 | WB11+WB14 |
| 0393 | W | 32 | WB11 | WB11+WB14 |
| 0394 | R | WB21 | 22 | WB21 |
| 0395 | R | WB19 | 23 | WB19 |
| 0396 | C | 22, 23 | 32 | WB21+WB19 |
| 0397 | W | 32 | WB19 | WB21+WB19 |
| 0398 | R | WB19 | 23 | WB19 |
| 0399 | R | WB24 | 22 | WB24 |
| 0400 | C | 22, 23 | 32 | WB19+WB24 |
| 0401 | W | 32 | WB24 | WB19+WB24 |
| 0402 | R | WB15 | 22 | WB15 |
| 0403 | R | WB25 | 23 | WB25 |
| 0404 | C | 22, 23 | 32 | WB15+WB25 |
| 0405 | W | 32 | WB25 | WB15+WB25 |
| 0406 | R | WB10 | 22 | WB10 |
| 0407 | C | 22, 23 | 33 | $WB10^{-1}$ |
| 0408 | W | 33 | WB10 | $WB10^{-1}$ |
| 0409 | R | WB10 | 23 | $WB10^{-1}$ |
| 0410 | C | 22, 23 | 31 | $WB10.WB10^{-1}$ |
| 0411 | W | 31 | WB16 | $WB10.WB10^{-}$ |
| 0412 | R | WB11 | 22 | WB11 |
| 0413 | C | 22, 23 | 31 | $WB11.WB10^{-1}$ |
| 0414 | W | 31 | WB23 | $WB11.WB10^{-1}$ |
| 0415 | R | WB24 | 22 | WB24 |
| 0416 | C | 22, 23 | 31 | $WB24.WB10^{-1}$ |
| 0417 | W | 31 | WB22 | $WB24.WB10^{-1}$ |
| 0418 | R | WB25 | 22 | WB25 |
| 0419 | C | 22, 23 | 31 | $WB25.WB10^{-1}$ |
| 0420 | W | 31 | WB21 | $WB25.WB10^{-1}$ |
| 0421 | R | WB23 | 22, 23 | WB23 |
| 0422 | C | 22, 23 | 31 | $WB23^2$ |
| 0423 | W | 31 | WB0 | $WB23^2$ |
| 0424 | R | WB22 | 23 | WB22 |
| 0425 | C | 22, 23 | 31 | WB22.WB23 |
| 0426 | W | 31 | WB1 | WB22.WB23 |
| 0427 | R | WB0 | 22 | WB0 |
| 0428 | C | 22, 23 | 32 | WB0+WB22 |
| 0429 | W | 32 | WB2 | WB0+WB22 |
| 0430 | R | WB2 | 22, 23 | WB2 |
| 0431 | C | 22, 23 | 31 | $WB2^2$ |
| 0432 | W | 31 | WB3 | $WB2^2$ |
| 0433 | R | WB3 | 23 | WB3 |
| 0434 | C | 22, 23 | 31 | WB2.WB3 |
| 0435 | W | 31 | WB4 | WB2.WB3 |
| 0436 | R | WB21 | 22 | WB21 |
| 0437 | R | WB1 | 23 | WB1 |

Subroutine E: Locate and Correct Triple Error
0300-0631 - Entered Only From Error Routine

| Sequence # | Function | Source | Destination | Subject |
|---|---|---|---|---|
| 0438 | C | 22, 23 | 32 | $WB21+WB1$ |
| 0439 | W | 32 | WB5 | $WB21+WB1$ |
| 0440 | R | WB5 | 22, 23 | WB5 |
| 0441 | C | 22, 23 | 31 | $WB5^2$ |
| 0442 | W | 31 | WB6 | $WB5^2$ |
| 0443 | R | WB6 | 22 | $WB5^2$ |
| 0444 | C | 22, 23 | 33 | $WB5^{-2}$ |
| 0445 | W | 33 | WB7 | $WB5^{-2}$ |
| 0446 | R | WB7 | 22 | $WB5^{-2}$ |
| 0447 | R | WB4 | 23 | WB4 |
| 0448 | C | 22, 23 | 31 | $WB4 \cdot WB5^{-2}$ |
| 0449 | W | 31 | WB8 | $WB4 \cdot WB5^{-2}$ |
| 0450 | R | WB8 | 22 | WB8 |
| 0451 | C | 22, 23 | 36 | $M \cdot WB8$ |
| 0452 | W | 36 | WB9 | $M \cdot WB8$ (root $r_1$) |
| 0453 | R | WB9 | 22 | $r_1$ |
| 0454 | R | WB16 | 23 | WB16 |
| 0455 | C | 22, 23 | 32 | $r_1+WB16$ |
| 0456 | W | 32 | WB17 | $r_1+WB16$ (root $r_2$) |
| 0457 | R | WB17 | 22 | $r_2$ |
| 0458 | R | WB5 | 23 | WB5 |
| 0459 | C | 22, 23 | 31 | $r_2 \cdot WB5$ |
| 0460 | W | 31 | WB14 | $r_2 \cdot WB5$ |
| 0461 | R | WB14 | 22 | WB14 |
| 0462 | C | 22, 23 | 34 | $WB14^{\frac{1}{2}}$ |
| 0463 | W | 34 | WB15 | $WB14^{\frac{1}{2}}$ |
| 0464 | R | WB15 | 22 | WB15 |
| 0465 | C | 22, 23 | 35, 33 | $WB15 \cdot \alpha^5$ |
| 0466 | W | 35 | WB12 | $WB15 \cdot \alpha^5$ |
| 0467 | W | 33 | WB13 | $WB15^{-1}$ |
| 0468 | R | WB12 | 22 | WB12 |
| 0469 | C | 22, 23 | 35, 33 | $WB12 \cdot \alpha^5$ |
| 0470 | W | 35 | WB17 | $WB12 \cdot \alpha^5$ |
| 0471 | W | 33 | WB16 | $WB12^{-1}$ |
| 0472 | R | WB17 | 22 | WB17 |
| 0473 | R | WB23 | 23 | WB23 |
| 0474 | C | 22,23 | 32,33 | $WB17+WB23$, $WB23^{-1}$ |
| 0475 | W | 33 | WB22 | $WB23^{-1}$ |
| 0476 | W | 32 | WB20 | $WB17+WB23$ |
| 0477 | R | WB22 | 23 | WB22 |
| 0478 | R | WB2 | 22 | WB2 |
| 0479 | C | 22,23 | 31 | $WB2 \cdot WB22$ |
| 0480 | W | 31 | WB19 | $WB2 \cdot WB22$ |
| 0481 | R | WB16 | 23 | WB16 |
| 0482 | C | 22,23 | 31 | $WB2 \cdot WB16$ |
| 0483 | W | 31 | WB18 | $WB2 \cdot WB16$ |
| 0484 | R | WB13 | 23 | WB13 |
| 0485 | C | 22,23 | 31 | $WB2 \cdot WB13$ |
| 0486 | W | 31 | WB14 | $WB2 \cdot WB13$ |
| 0487 | R | WB20 | 22 | WB20 |
| 0488 | R | WB19 | 23 | WB19 |
| 0489 | C | 22,23 | 32 | $WB19+WB20$ |
| 0490 | W | 32 | WB0 | $l_3$ |
| 0491 | R | WB23 | 22 | WB23 |
| 0492 | R | WB12 | 23 | WB12 |
| 0493 | C | 22,23 | 32 | $WB12+WB23$ |
| 0494 | W | 32 | WB1 | $WB12+WB23$ |
| 0495 | R | WB15 | 23 | WB15 |
| 0496 | C | 22,23 | 32 | $WB23+WB15$ |
| 0497 | W | 32 | WB2 | $WB23+WB15$ |
| 0498 | R | WB1 | 22 | WB1 |
| 0499 | R | WB18 | 23 | WB18 |
| 0500 | C | 22, 23 | 32 | $WB1+WB18$ |
| 0501 | W | 32 | WB8 | $l_2$ |
| 0502 | R | WB2 | 22 | WB2 |
| 0503 | R | WB14 | 23 | WB14 |
| 0504 | C | 22, 23 | 32 | $WB2+WB14$ |
| 0505 | W | 32 | WB6 | $WB2+WB14$ or $l_1$ |
| 0506 | R | WB8 | 22, 23 | $WB8$ or $l_2$ |
| 0507 | C | 22, 23 | 31 | $WB8^2$ |
| 0508 | W | 31 | WB26 | $WB8^2$ or $l_2^2$ |
| 0509 | R | WB0 | 23 | $WB0$ ($l_3$) |
| 0510 | C | 22, 23 | 32 | $WB0+WB2$ |
| 0511 | W | 32 | WB27 | $WB0+WB2$ |
| 0512 | R | WB26 | 22 | WB26 |
| 0513 | C | 22, 23 | 31 | $WB26 \cdot WB0$ |
| 0514 | W | 31 | WB28 | $WB26 \cdot WB0$ |
| 0515 | R | WB0 | 22 | $WB0$ or $l_3$ |
| 0516 | C | 22, 23 | 31 | $WB0^2$ or $l_3^2$ |
| 0517 | W | 31 | WB29 | $l_3^2$ |
| 0518 | R | WB6 | 23 | $l_1$ |
| 0519 | C | 22, 23 | 32 | $l_1+l_3$ |
| 0520 | W | 32 | WB30 | $l_2+l_3$ |
| 0521 | R | WB29 | 22 | $l_3^2$ |
| 0522 | C | 22,23 | 31 | $l_1 l_3^2$ |
| 0523 | W | 31 | WB31 | $l_1 l_3^2$ |
| 0524 | R | WB8 | 23 | $l_2$ |
| 0525 | C | 22,23 | 31 | $l_2^2 l_2$ |
| 0526 | W | 31 | WB32 | $l_3^2 l_2$ |
| 0527 | R | WB6 | 22,23 | $l_1$ |
| 0528 | C | 22,23 | 31 | $l_1 l_2$ |
| 0529 | W | 31 | WB33 | $l_1 l_2$ |
| 0530 | R | WB26 | 23 | $l_2^2$ |
| 0531 | C | 22,23 | 31 | $l_2^2 l_1$ |
| 0532 | W | 31 | WB34 | $l_2^2 l_1$ |
| 0533 | R | WB29 | 22 | $l_3^2$ |
| 0534 | C | 22,23 | 32 | $l_3^2+l_2^2$ |
| 0535 | W | 32 | WB35 | $l_3^2+l_2^2$ |
| 0536 | R | WB33 | 23 | $l_1$ |
| 0537 | R | WB8 | 22 | $l_2$ |
| 0538 | C | 22,23 | 31 | $l_1^2 l_2$ |
| 0539 | W | 31 | WB36 | $l_1^2 l_2$ |
| 0540 | R | WB0 | 22 | $l_3$ |
| 0541 | C | 22,23 | 31 | $l_1^2 l_3$ |
| 0542 | W | 31 | WB37 | $l_1^2 l_3$ |
| 0543 | R | WB32 | 22 | WB32 |
| 0544 | R | WB28 | 23 | WB28 |
| 0545 | C | 22,23 | 32 | $WB32+WB28$ |
| 0546 | W | 32 | WB28 | $WB32+WB28$ |
| 0547 | R | WB31 | 22 | WB31 |
| 0548 | R | WB37 | 23 | WB37 |
| 0549 | C | 22,23 | 32 | $WB31+WB37$ |
| 0550 | W | 32 | WB32 | $WB31+WB37$ |
| 0551 | R | WB34 | 22 | WB34 |
| 0552 | R | WB36 | 23 | WB36 |
| 0553 | C | 22,23 | 32 | $WB34+WB36$ |
| 0554 | W | 32 | WB34 | $WB34+WB36$ |
| 0555 | R | WB28 | 22 | WB28 |
| 0556 | R | WB0 | 23 | S0 |
| 0557 | C | 22,23 | 31 | $S0 \cdot WB28$ |
| 0558 | W | 31 | WB31 | $S0 \cdot WB28$ |
| 0559 | R | WB32 | 23 | WB32 |
| 0560 | C | 22,23 | 32 | $WB32+WB28$ |
| 0561 | W | 32 | WB32 | $WB32+WB28$ |
| 0562 | R | SB0 | 22 | S0 |
| 0563 | C | 22,23 | 31 | $S0 \cdot WB32$ |
| 0564 | W | 31 | WB28 | $S0 \cdot WB32$ |
| 0565 | R | WB34 | 22 | WB34 |
| 0566 | R | WB32 | 23 | WB32 |
| 0567 | C | 22,23 | 32 | $WB32+WB34$ |
| 0568 | W | 32 | WB34 | $WB32+WB34$ |
| 0569 | R | SB1 | 22 | S1 |
| 0570 | R | WB35 | 23 | WB35 |
| 0571 | C | 22,23 | 31 | $S1 \cdot WB35$ |
| 0572 | W | 31 | WB35 | $S1 \cdot WB35$ |
| 0573 | R | WB30 | 22, 23 | WB30 |
| 0574 | C | 22,23 | 31 | $WB30^2$ |
| 0575 | W | 31 | WB30 | $WB30^2$ |
| 0576 | R | SB2 | 22 | S2 |
| 0577 | C | 22,23 | 31 | $S2 \cdot WB35$ |
| 0578 | W | 31 | WB36 | $S2 \cdot WB35$ |
| 0579 | R | WB27 | 23 | WB27 |
| 0580 | C | 22,23 | 31 | $S2 \cdot WB27$ |
| 0581 | W | 31 | WB37 | $S2 \cdot WB27$ |
| 0582 | R | SB1 | 22 | S1 |
| 0583 | R | WB30 | 23 | WB3 |
| 0584 | C | 22, 23 | 31 | $S1 \cdot WB3$ |
| 0585 | W | 31 | WB30 | $S1 \cdot WB3$ |
| 0586 | R | WB31 | 22 | WB31 |
| 0587 | R | WB35 | 23 | WB35 |
| 0588 | C | 22, 23 | 32 | $WB31+WB35$ |
| 0589 | W | 32 | WB27 | $WB31+WB35$ |
| 0590 | R | WB27 | 22 | WB27 |
| 0591 | R | WB37 | 32 | WB37 |
| 0592 | C | 22, 23 | 32 | $WB27+WB37$ |
| 0593 | W | 32 | WB37 | $WB27+WB37$ |
| 0594 | R | WB28 | 22 | WB28 |
| 0595 | R | WB30 | 23 | WB30 |
| 0596 | C | 22, 23 | 32 | $WB28+WB30$ |
| 0597 | W | 32 | WB30 | $WB28+WB30$ |
| 0598 | R | WB30 | 23 | WB30 |
| 0599 | R | WB36 | 22 | WB36 |
| 0600 | C | 22, 23 | 32 | $WB30+WB36$ |
| 0601 | W | 32 | WB33 | $WB30+WB36$ |
| 0602 | R | WB34 | 22 | WB34 |
| 0603 | C | 22, 23 | 33 | $WB34^{-1}$ |
| 0604 | W | 33 | WB34 | $WB34^{-1}$ |
| 0605 | R | WB34 | 22 | $WB34^{-1}$ |
| 0606 | R | WB37 | 23 | $e_1$ |
| 0607 | C | 22, 23 | 31 | $WB34^{-1} \cdot WB37$ |
| 0608 | W | 31 | WB37 | $WB34^{-1} \cdot WB37$ |
| 0609 | R | WB33 | 23 | $e_2$ |
| 0610 | C | 22, 23 | 31 | $WB34^{-1} \cdot e_2$ |
| 0611 | W | 31 | WB33 | $WB34^{-1} \cdot e_2$ |
| 0612 | R | WB37 | 22 | $e_1$ |

-continued

| Subroutine E: Locate and Correct Triple Error 0300-0631 - Entered Only From Error Routine | | | | |
|---|---|---|---|---|
| Sequence # | Function | Source | Destination | Subject |
| 0613 | R | WB33 | 23 | $e_2$ |
| 0614 | C | 22, 23 | 32 | $e_1+e_2$ |
| 0615 | W | 32 | WB32 | $e_1+e_2$ |
| 0616 | R | WB32 | 23 | $e_1+e_2$ |
| 0617 | R | SB0 | 22 | S0 |
| 0618 | C | 22, 23 | 32 | $e_3$ |
| 0619 | W | 32 | WB27 | $e_3$ |
| 0620 | R | DB-WB6 | 22 | Byte in Error - $l_1$ |
| 0621 | R | WB37 | 23 | $e_1$ |
| 0622 | C | 22, 23 | 32 | $e_1+$(DB-WB6) |
| 0623 | W | 32 | DB-WB$^6$ | Corrected Data Byte |
| 0624 | R | DB-WB8 | 23 | Byte in Error-$l_2$ |
| 0625 | R | WB33 | 22 | $e_2$ |
| 0626 | C | 22, 23 | 32 | $e_2+$(DB-WB8) |
| 0627 | W | 32 | DB-WB8 | Corrected Data Byte-$l_2$ |
| 0628 | R | DB-WB0 | 23 | Byte in Error-$l_3$ |
| 0629 | R | WB27 | 22 | $e_3$ |
| 0630 | C | 22, 23 | 32 | $e_3+$(DB-WB0) |
| 0631 | W | 32Z | DB-WB0 | Corrected Data Byte-$l_3$ |

$CPU_{40}$ enters a data transmittal program.

Subroutine E above invokes the principles of the present invention including the application of linearized and affine polynomials for indicating errors.

The present invention is equally applicable to locating and correcting four symbols in error. Rather than repeat any of the above descriptions, the machine algorithm for achieving four symbol in error location is briefly explained. Such a code is Distance 9. The message has eight rather than six check characters. The decoder operates with eight syndromes rather than six. Otherwise, the decoder hardware is identical.

Locating and correcting four symbols in error requires solving the quartic:

$$X^4 + \lambda_1 X^3 + \lambda_2 X^2 + \lambda_3 X + \lambda_4 = 0 \tag{47}$$

for its 4 roots; the roots are the error locations. The description assumes the coefficients $\lambda_1$, $\lambda_2$, $\lambda_3$, $\lambda_4$ were determined from the syndrome equations. Substitute:

$$y = x + \left(\frac{\lambda_3}{\lambda_1}\right)^{\frac{1}{2}} \tag{48}$$

into equation (47) to yield:

$$y^4 + \lambda_1 y^3 + y^2(\lambda_3^{\frac{1}{2}} \lambda_1^{\frac{1}{2}} + \lambda_2) + \frac{\lambda_3^2}{\lambda_1^2} + \frac{\lambda_3 \lambda_2}{\lambda_1} + \lambda_4 = 0 \tag{49}$$

This action removes the linear term from (47). Then substitute:

$$y = 1/z \tag{50}$$

into equation (49) to produce:

$$\frac{1}{z^4} + \frac{\lambda_1}{z^3} + \frac{(\lambda_3^{\frac{1}{2}} \lambda_1^{\frac{1}{2}} + \lambda_2)}{z^2} + \frac{\lambda_3^2}{\lambda_1^2} + \frac{\lambda_3 \lambda_2}{\lambda_1} + \lambda_4 = C \tag{51}$$

Then; multiply (51) by $z^4$ to produce:

$$1 + \lambda_1 z + (\lambda_3^{\frac{1}{2}} \lambda_1^{\frac{1}{2}} + \lambda_2) z^2 + \left(\frac{\lambda_3^2}{\lambda_1^2} + \frac{\lambda_3 \lambda_2}{\lambda_1} + \lambda_4\right) z^4 = 0 \tag{52}$$

This action removes the cubic term from (49) and (52) is affine polynomial. Then, multiply (52) by:

$$\frac{1}{\left(\frac{\lambda_3^2}{\lambda_1^2} + \frac{\lambda_3 \lambda_2}{\lambda_1} + \lambda_4\right)} \tag{53}$$

to produce:

$$0 = z^4 + z^2 \frac{(\lambda_3^{\frac{1}{2}} \lambda_1^{\frac{1}{2}} \lambda_2)}{\left(\frac{\lambda_3^2}{\lambda_1^2} + \frac{\lambda_3 \lambda_2}{\lambda_1} + \lambda_4\right)} + z \frac{\lambda_1}{\left(\frac{\lambda_3^2}{\lambda_1^2} + \frac{\lambda_3 \lambda_2}{\lambda_1} + \lambda_4\right)} + \frac{1}{\left(\frac{\lambda_3^2}{\lambda_1^2} \frac{\lambda_3 \lambda_2}{\lambda_1} + \lambda_4\right)} \tag{54}$$

Then let:

$$A = \frac{(\lambda_3^{\frac{1}{2}} \lambda_1^{\frac{1}{2}} + \lambda_2)}{\left(\frac{\lambda_3^2}{\lambda_1^2} + \frac{\lambda_3 \lambda_2}{\lambda_1} + \lambda_4\right)} \tag{55}$$

$$B = \frac{\lambda_1}{\left(\frac{\lambda_3^2}{\lambda_1^2} + \frac{\lambda_3 \lambda_2}{\lambda_1} + \lambda_4\right)} \tag{56}$$

$$C = \frac{1}{\left(\frac{\lambda_3^2}{\lambda_1^2} + \frac{\lambda_3 \lambda_2}{\lambda_1} + \lambda_4\right)} \tag{57}$$

Then (54) simplies to:

$$Z^4 + Az^2 + Bz + C = 0 \tag{58}$$

Assuming that (58) can be written as the product of two quadratic factors.

$$z^4 + Az^2 + Bz + C = (z^2 + Kz + m)(z^2 + lz + n) \tag{59}$$

Then, multiply the two quadratic factors together to produce:

$$0 + z^4 + z^3(l+K) + z^2(m + n + Kl) + z(lm + nK) + nm \tag{60}$$

Equating the coefficients produces:

$$l + K = 0 \tag{61}$$

$$m + n + Kl = A \tag{62}$$

$$lm + nK = B \tag{63}$$

$$mn = C \tag{64}$$

Since the fields have the characteristic 2, $l + K = 0$ implies that $l=K$. The above system then reduces to $$m + n + K^2 = A \tag{62A}$$

$$K(m + n) = B \tag{63A}$$

$$mn = C \tag{64A}$$

or $$m + n + K^2 + A \quad (65)$$

$$m + n = B/K \quad (66)$$

$$mn + C \quad (64)$$

From the above:

$$K^2 + A = B/K \quad (67)$$

Multiplying by K produces:

$$K^3 + AK = B \quad (68)$$

or $$K^3 + AK + B = 0 \quad (69)$$

The addition and subtraction operations are the same. Substitute: $K = l + (A/l)$ into (69) to produce:

$$l^3 + (A^3/l^3) + B = 0 \quad (70)$$

multiply (70) by $l^3$ $$l^6 + A^3 + Bl^3 = 0 \quad (71)$$

Now in terms of $l^3$ (71) can be written as a quadratic.

$$(l^3)^2 + B(l^3) + A^3 = 0 \quad (72)$$

divide (72) by $B^2$ $$((l^3)/B^2) + ((l^3)/B) + (A^3/B^2) = 0 \quad (73)$$

Then, in equation (73), substitute $q = (l^3/B)$ $$q^2 + q = (A^3/B^2) \quad (74)$$

From the previous description for locating two error and three errors, equation (74) can be solved for its two roots by multiplying $A^3/B^2$ by the matrix [M], whose construction has been described before. Therefore, the two roots of (74) are:

$$q_1 = [A^3/B][M] \quad (76)$$

$$q_2 = q_1 + l^0 \quad (77)$$

Then, by back substitution:

$$l^3 = Bq \quad (78)$$

For error location either $q_1$ or $q_2$ are usable to obtain $l^3$; the description uses $q_2$:

$$l^3 = Bq_2$$

One of the cube roots of $l^3$ can be obtained either by table lookup or logic circuits having calculated $l$ (any cube root will do) the below equation obtains K.

$$K = l + (A/l) \quad (69)$$

The term K is one of the coefficients of the quadratic factors.

Next the terms $m$, $n$ are to be obtained from equation (64):

$$n = (c/m) \quad (79)$$

Substituting (79) into equation (66) produces $$m + (c/m) = B/K \quad (80)$$

multiplying (80) by $m$:

$$m^2 + B/K\, m + c = 0 \quad (81)$$

Dividing (81) by $B^2/K^2$ produces $$\frac{m^2}{\frac{B^2}{K^2}} + \frac{m}{\frac{B}{K}} + \frac{C}{\frac{B^2}{K^2}} = 0 \quad (82)$$

In (82) substituting $f = (m/B/K)$ produces $$f^2 + f + (C/B^2/K^2) = 0 \quad (83)$$

Equation (83) is a reduced affine polynomial whose roots can be found by multiplying $(CK^2/B^2)$ times the matrix [M]. The roots are then $$f_1 = \left[\frac{CK^2}{B^3}\right][M] \quad (84)$$

$$f_2 = f_1 + a^0 \quad (85)$$

Back substitution yields:

$$m = (f_2 B/K) \quad (86)$$

and then $n$ can be determined from equation (64).

The coefficients of the quadratic factors set forth at (69) are defined in terms of the original $\lambda_i$. The roots of equation (58) are now available by solving the two quadratics by reducing same to reduced affine polynomials:

$$z^2 + Kz + m = 0 \quad (87)$$

compare with equation (27) and (41).

Divide (87) by $K^2$ to obtain:

$$\frac{z^2}{K^2} + \frac{z}{K} + \frac{m}{K^2} = 0 \quad (88)$$

Let $$g = (z/k) \quad (89)$$

Substituting (89) into (88) yields:

$$g^2 + g + (m/K^2) = 0 \quad (90)$$

then:

$$g_1 = [m/K^2][M] \quad (91)$$

$$g_2 = g_1 + a^0 \quad (92)$$

Since $$z^2 + Kz + n = 0 \quad (93)$$

(compare with equation (87)) divide by $K^2$ to obtain $$z^2/K^2 + z/K + n/K^2 = 0. \quad (94)$$

Let $$h = (z/K) \text{ to obtain:} \quad (95)$$

$$h^2 + h + (h/K^2) = 0. \quad (96)$$

Then:

$$h_1 = [h/K^2][M] \quad (97)$$

$$h_2 = h_1 + a^0 \quad (98)$$

Back substituting, the four roots of (58) are:

$$z_1 = Kg_1 \quad (99)$$

$$z_2 = Kg_2 \quad (100)$$

$$z_3 = Kg_3 \quad (101)$$

$$z_4 = Kg_4 \quad (102)$$

The four roots of the original error location polynomial are:

$$l_1 = \frac{1}{z_1} + \left(\frac{\lambda_3}{\lambda_1}\right)^{\frac{1}{2}} \tag{103}$$

$$l_2 = \frac{1}{z_2} + \left(\frac{\lambda_3}{\lambda_1}\right)^{\frac{1}{2}} \tag{104}$$

$$l_3 = \frac{1}{z_3} + \left(\frac{\lambda_3}{\lambda_1}\right)^{\frac{1}{2}} \tag{105}$$

$$l_4 = \frac{1}{z_4} + \left(\frac{\lambda_3}{\lambda_1}\right)^{\frac{1}{2}} \tag{106}$$

identifying the locations of the four symbols in error.

EXAMPLE OF ONE CALCULATION PROCEDURE $$\text{Calculate } 0 = \left(\frac{\lambda_3^2}{\lambda_1^2} + \frac{\lambda_3 \lambda_2}{\lambda_1} + \lambda_4\right) \tag{107}$$

$$\text{Calculate } O = (\lambda_1^3 \lambda_1^4 + \lambda_2) \tag{108}$$

$$\text{Calculate } R = \frac{O^3}{\lambda_1^7 \cdot 0} \tag{109}$$

Calculate $q_1 = [R][M]$ (110)

Calculate $q_2 = q_1 + a^0$ (111)

$$\text{Calculate } l^3 = \frac{\lambda_1 q_2}{0} \tag{112}$$

Lookup or Calculate $l$ (113)

$$\text{Calculate } k = l + \frac{0}{l \cdot 0} \tag{114}$$

$$\text{Calculate } F = \frac{K^2 \cdot 0}{\lambda_1^2} \tag{115}$$

Calculate $f_1 = [F][M]$ (116)

Calculate $f_2 = f_1 + a^0$ (117)

$$\text{Calculate } n = \frac{f_2 \lambda_1}{0 \cdot K} \tag{118}$$

$$\text{Calculate } m = \frac{1}{0 \cdot n} \tag{119}$$

$$\text{Calculate } G = \frac{m}{K^2} \tag{120}$$

Calculate $g_1 = [G][M]$ (121)

Calculate $g_2 = g_1 + a^0$ (122)

$$\text{Calculate } H = \frac{n}{K^2} \tag{123}$$

Calculate $h_1 = [H][M]$ (124)

Calculate $h_2 = h_2 + a^0$ (125)

Calculate $z_1 = Kg_1$ (125)

$z_2 = Kg_2$ (127)

$z_3 = Kh_1$ (128)

$z_4 = Kh_2$ (129)

$$\text{Calculate } J = \left(\frac{\lambda_3}{\lambda_1}\right)^{\frac{1}{2}}$$

The error locations are $l_1 = z_1^{-1} + J$ (131)

$l_2 = z_2^{-1} + J$ (132)

$l_3 = z_3^{-1} + J$ (133)

$l_4 = z_4^{-1} + J$ (135)

While the invention has been particularly shown and described with reference to preferred embodiments thereof, it will be understood by those skilled in the art that various changes in form and details may be made therein without departing from the spirit and scope of the invention.

What is claimed is:

1. For an error locating decoder, means receiving a given number of data symbols and 2N check symbols, N being a positive integer, means generating 2N error syndrome signals using said received symbols and based upon a predetermined generator polynomial;

means including generator polynomial means receiving said data and 2N check symbols for indicating the number of symbols in error, up to N symbols in error;

the improvement being an error location apparatus, in combination:

means realizing an affine polynomial for receiving said 2N syndrome signals to generate a predetermined number of root symbol signals;

means selecting said root symbol signals exhibiting a predetermined Trace function; and means combining said selected root symbol signals with said syndrome signals to indicate error location.

2. Error location apparatus;

means for receiving error syndrome signals relatable to N symbols in error, N is an integer of two or greater, the improvement including the combination:

a syndrome buffer element for storing up to 2N syndrome signals, a work buffer store element an $a^i$ register element an $a^j$ register element a finite field element processor for receiving signals from said registers for supplying finite field result signals, a data signal buffer element, sequence means connected to all above-mentioned elements for testing operations thereof and transferring signals therebetween, said sequence means including a control store for storing program control signals defining an affine polynomial relationship between said syndrome signals whereby said above-mentioned elements interact in accordance with said affine polynomial relative to define symbols in error, and a single parity tree element in said finite element processor element element for use with any number of symbols in error.

* * * * *

UNITED STATES PATENT AND TRADEMARK OFFICE
CERTIFICATE OF CORRECTION

PATENT NO. : 4,099,160
DATED : July 4, 1978
INVENTOR(S) : H. L. Flagg

It is certified that error appears in the above-identified patent and that said Letters Patent are hereby corrected as shown below:

Abstract, line 11, after "array", insert --logic, program, or hybrid types.--

Column 3, line 43, delete ". The".

Column 24, line 63, after "finite", insert --field--.

Column 24, line 64, delete "element element".

Signed and Sealed this

Sixteenth Day of January 1979

[SEAL]

Attest:

RUTH C. MASON
Attesting Officer

DONALD W. BANNER
Commissioner of Patents and Trademarks